United States Patent [19]

Crouse

[11] 4,264,974
[45] Apr. 28, 1981

[54] OPTIMIZED DIGITAL DELTA MODULATION COMPANDER HAVING TRUNCATION EFFECT ERROR RECOVERY

[75] Inventor: William G. Crouse, Raleigh, N.C.

[73] Assignee: International Business Machines Corporation, Armonk, N.Y.

[21] Appl. No.: 103,891

[22] Filed: Dec. 17, 1979

[51] Int. Cl.³ .................. H03K 13/22; H04B 12/04
[52] U.S. Cl. .................................. 375/32; 332/11 D
[58] Field of Search .............. 375/24, 25, 26, 27, 375/28, 29, 30, 31, 32; 340/347 AD; 332/11 D; 333/14; 358/261, 135

[56] References Cited

U.S. PATENT DOCUMENTS

| | | | |
|---|---|---|---|
| 3,922,606 | 11/1975 | Nordling | 325/38 B |
| 3,922,619 | 11/1975 | Thompson | 332/11 D |
| 3,991,269 | 11/1976 | Brown | 178/68 |
| 3,995,218 | 11/1976 | Moriya | 325/38 B |
| 4,110,705 | 8/1978 | Crouse | 332/11 D |
| 4,123,709 | 10/1978 | Dodds | 325/38 B |
| 4,199,722 | 4/1980 | Paz | 375/27 |
| 4,208,740 | 6/1980 | Yin | 375/30 |

*Primary Examiner*—Benedict V. Safourek
*Assistant Examiner*—Stephen Chin
*Attorney, Agent, or Firm*—Edward H. Duffield

[57] ABSTRACT

A digital delta modulation compander circuit makes advantageous use of the mathematical truncation created during the computation of step sizes to create a non-linear step size variation which differs from the optimum desired step size but causes convergence recovery during error conditions. It has been discovered that the truncation involved in the inaccurate approximation of mathematical calculation of the step sizes produces an advantageous result which leads to an optimized digital delta modulation compander that will recover from transmission errors over a wider range and with greater efficiency than other methods.

12 Claims, 3 Drawing Figures

OPTIMIZED DIGITAL DELTA MODULATION COMPANDER HAVING TRUNCATION EFFECT ERROR RECOVERY

TECHNICAL FIELD

This invention relates to digital voice transmission schemes and techniques and to digital transmission using delta modulation with companders in particular.

PRIOR ART

It is well known that delta modulators with a companding function provide an effective, economical means of digitizing analog signals such as speech at bit rates in the range of 32 kilobits per second. It is an appealing technique for analog to digital conversion and transmission and reconversion, particularly for an error- prone environment such as satellite "voice" communications. Digital implementation of the analog transmission functions can greatly enhance the usefulness of delta modulation since it allows time sharing of various hardware elements utilized between modulator, demodulator and the multiple input and output ports that may be employed.

In satellite transmission environments, however, severe bit error rates may be encountered. The bit errors can cause significant error in tracking of the modulator and demodulator companders. The problem is conventionally solved in the prior art by adding non-linear functions to the companding algorithm which degrade the companding accuracy and reduce the companding range while increasing cost.

OBJECTS OF THE INVENTION

In light of the foregoing general deficiencies in the prior art, it is an object of this invention to provide an improved, more optimum delta modulation compander which will achieve the desired properties without significant compromise in the range and accuracy of the companding function.

SUMMARY

The foregoing and yet other unenumerated objects of the present invention are met by providing an improved compander which adjusts the gain of the modulator and demodulator for dynamically tracking a speech signal or other analog waveform. In general, such companders are well known and operate generally as follows:

Most companders in use compute the companding value, normally called the "step size", by analyzing a bit stream to determine whether to step plus or minus the present step size. Analyzing the bit stream enables one to monitor the slope overload conditions. Slope overload occurs when the step size is too small to allow the modulator to maintain tracking with the input signal. This condition is indicated when the output bit stream has a high occurrence of similar bits, such as runs of ones or zeros. When these runs are too long or occur too frequently, the compander should increase the step size; whereas if the runs are too infrequent, the step size should be reduced since, when it is too large, excessive noise is generated.

Stastically, there is some optimum step size for all stationery signals or signals that approximately repeat themselves every several milliseconds or less such as sinusoidal waves or periodic speech signals, modem signals, etc. An optimum step size occurs just short of the slope overload condition and is very much affected by the signal level frequency and feedback used in the integrators of filters in the system.

A means for determining the proper step size is commonly employed which monitors the occurrence of a condition in which the last N bits are alike. It has now been unexpectedly discovered and demonstrated through computer simulation and laboratory tests that the density of the occurrence of N bits being alike is consistent when the optimum step size is achieved and that the density is independent of the signal spectrum or amplitude or of the feedback used in the integrator system. This density of occurrences when the last N bits are alike is an accurate indicator of the slope overload condition or of the optimum step size being maintained at least until the half cycle time of the signal approaches the time it takes for the N bits to be generated and sent. As a result, measuring long run length is often a poor measure of the slope overload condition and at a typical 32 kilohertz sampling rate, a telephone voice spectrum monitored for runs of four or five like bits would produce undesirable results.

As stated earlier, the general technique of measuring or detecting a run of N like bits is not new. Early companders of the general nature employed have monitored the bit stream for the raw occurrence of the last N bits being alike. Typically runs of three or four like bits have been employed, but runs of two have also been used and four appears to be presently the most popular.

It has been unexpectedly discovered that when the step size is optimum, the ratio between the number of occurrences when the last three bits are alike compared to when they are not alike is one to three. If such a ratio is measured for only the last two bits, it will yield nearly twice this density and if it is measured for four bits, it will yield a density many times less than the preferred one to three ratio.

The most general adopted approach in the prior art upon the detection of the last N bits being alike is simple. If the last N bits are alike, increase the step size. If the last N bits are not alike, decrease the step size. However, the problem always present involves the question of how much should the step size be increased or decreased.

It has been discovered that if the changes in the signal level are small with respect to the value of the step size itself, then the companding will be smooth and the step size will hold at an optimum for stable signals. Secondly, the ratio of N like bits to unlike bits will equal the ratio of decrease to increase (i.e., the number of increases times the amount of increase must equal the number of decreases times the amount of decrease or the step size will change to make this so). The ratio of increase to decrease determines directly the accuracy of the companding function. Furthermore, to achieve a wide and accurate companding range, the ratio of increase to decrease should be independent of signal level. Fourthly, to achieve a transient response which is independent of signal level, the increase and decrease must be a constant percentage of the step size. Fifth, for error recovery, the density of like bits should vary with step size to convey over some period of time the absolute step size that the modulator has achieved. This, of course, demands that the ratio of decrease to increase be not a constant and independent of signal level. Sixth, to achieve optimum dynamic response for speech signals, the increase and decrease should provide a suitable attack and decay time.

Examining these requirements in some detail, it will be noted that there are some conflicting ones. The sixth mentioned item is generally accepted as an important criteria. It is known that an attack time for speech and speech spectrum modems should be faster than the decay time. This is due generally to two things. First, the signal to noise ratio will fall off very rapidly if the step size is too small and causes slope overload. Speech has a faster attack time than its decay time so many experts choose an attach rate three times as fast as the decay. The ratio is subjectively desirable for voice and is effective for modems. The attack time itself should be sufficient to prevent extended slope overload conditions. A five millisecond attack to maximum step size time meets the touch tone requirements of the telephone system and will meet or exceed requirements for speech.

Noting the fifth vs. third and fourth requirements above, the most significant effect of transmission errors if the compander is not optimized to handle them is that the compander will exhibit error. The demodulation compander will receive a bit pattern under error conditions which differs from that the modulator sent. As a result, the step size in the demodulator will differ markedly from that in the modulator and a gain error will occur. To solve the problem there must be some function unique in the bit pattern that is a function of step size itself. This requirement demands that the compander not scale the step size exactly to the experienced signal but to create an error which is a function of step size itself. Putting this requirement differently for the present invention, the ratio of occurrences of N like bits to unlike bits must vary as a function of the step size. This means that the ratio of step size increase to decrease should change with step size itself. This is in conflict with the requirements 3 and 4 above, but is necessary in an error prone environment in order to recover the accurate step size being generated.

DETAILED SPECIFICATION

Figure 1:
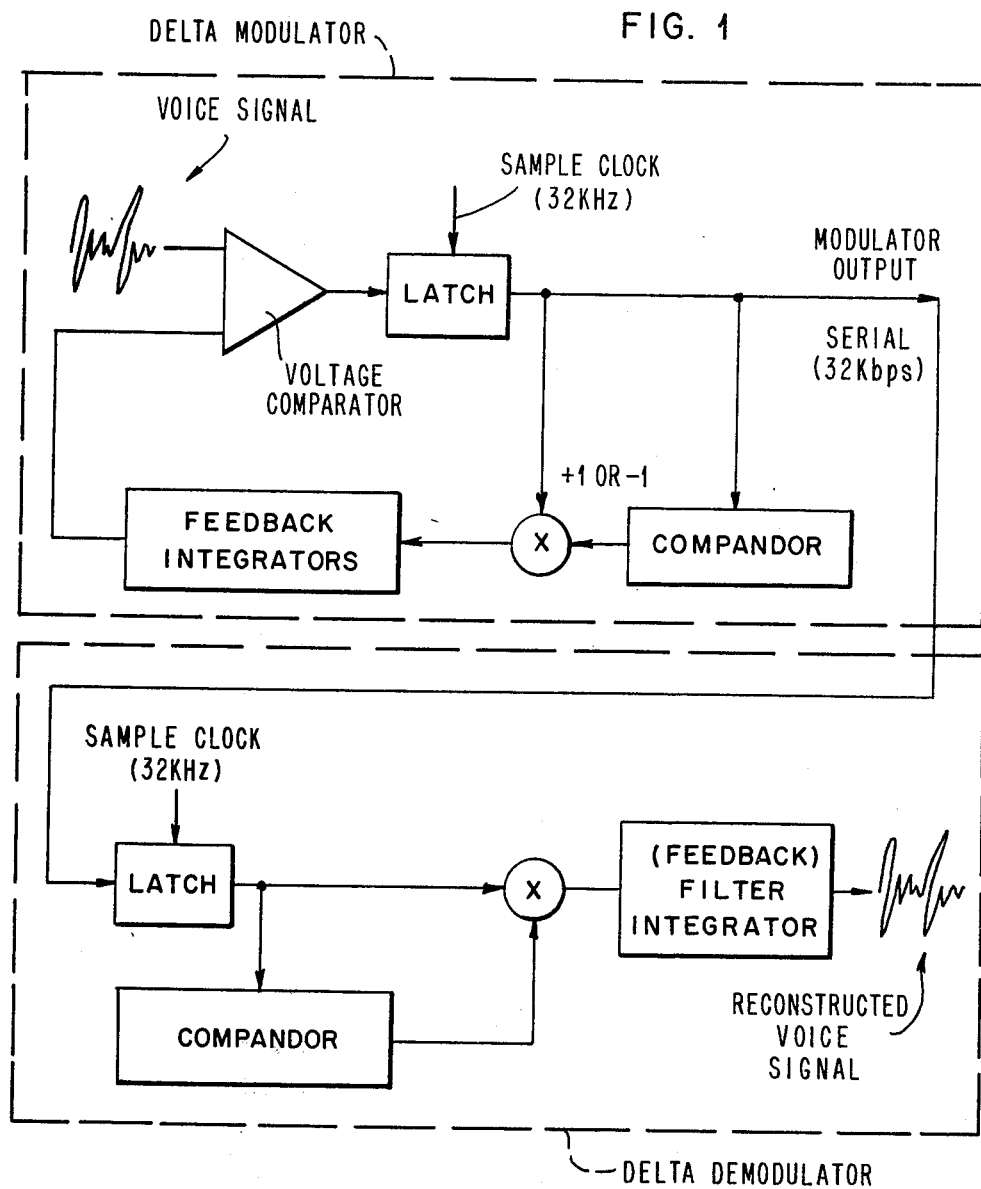
FIG. 1 shows a typical delta modulator and demodulator with a companding function.

Turning to FIG. 1, a conventional delta modulator and demodulator with a companding function is schematically illustrated. It is the compander function module that is of interest in the present invention. In the general prior art circuit shown in FIG. 1, the compander adjusts the gain of the modulator or demodulator to track the dynamics of the input analog signal such as a speech signal. This allows a significant reduction in the required bit rate. The compander should not be confused with an automatic gain control. Its output is simply a voltage or numeric value in the digital sense which will vary from large values to small ones, never reversing sign as it tracks the signal.

Figure 2:
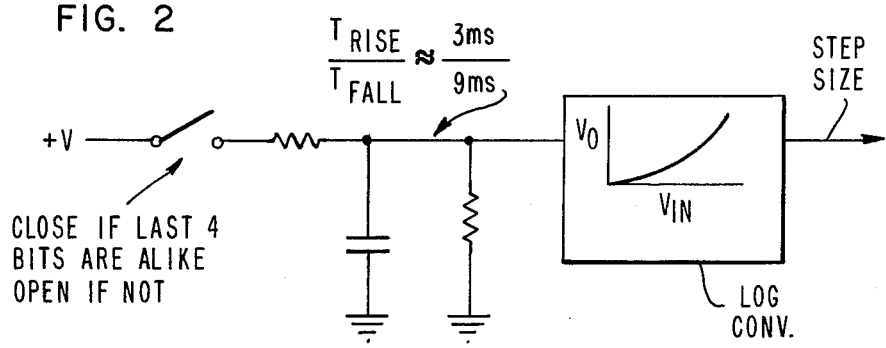
FIG. 2 shows a typical prior art compander.

A typical prior art compander is shown in FIG. 2. A desired three to one attack to decay time is attemptedly implemented in FIG. 2. However, the nature of the time constants employed given only an average value of three to one since at low levels it is much greater than three to one and at high levels, is much less than three to one. The circuit yields good error recovery but falls short on other accounts that are desired as shown above. As shown in FIG. 2, a logarithmatic converter made up of one or several segments may be used to attempt a change in step size that will be proportional to the step size itself. However, this may only be done at the cost of greater circuit complexity and expense and often must be compromised if it is to be economically implemented.

Figure 3:
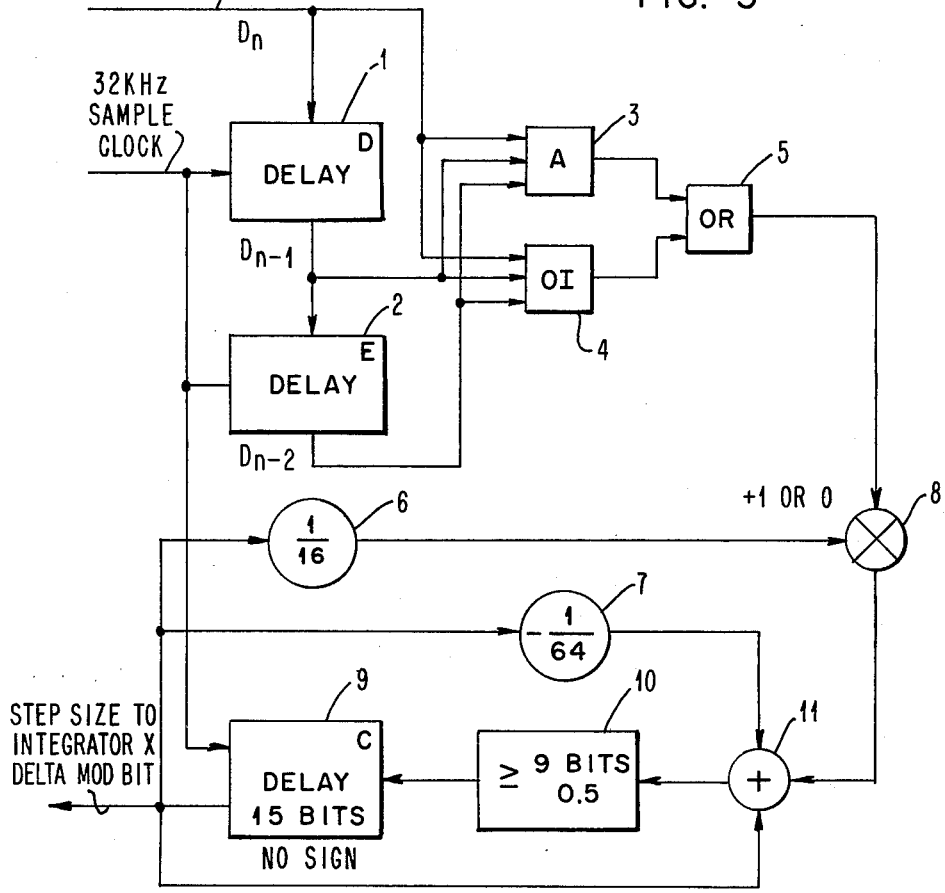
FIG. 3 shows the digital compandor of the invention.

FIG. 3 shows a digital compander of the preferred form according to the present invention. As will be detailed below, truncation errors are important aspects of the present invention, but neglecting the truncation errors, the compander in FIG. 3 performs the following function:

$$\Delta_n = \Delta_{n-1} + \frac{\Delta_{n-1}}{16} (D_n = D_{n-1} = D_{n-2}) - \frac{\Delta_{n-1}}{64}$$

In the foregoing equation, $\Delta_n$ is the step size that is calculated for the bit time n and $D_n$ is the delta modulation bit for the bit time n. Neglecting the truncation effects, the circuit shown in FIG. 3 holds the increase to decrease at a constant three to one ratio and at a constant percentage provides the optimum three to one attack to decay rate at all levels. The attack function utilized covers the 54db companding range in approximately five milliseconds or less. The circuit shown in FIG. 3 so far provides an optimum result in all of the conditions listed above except for error recovery.

It is in error recovery that the truncation effect noted above becomes important. It is recalled that for good error recovery, it is desired that the density of the last three bits being alike vary as a function of step size. The digital implementation for the companding circuit function shown in FIG. 3 does not have infinite resolution. In practice, only 15 bits are used and there is no sign bit. To obtain 1/16 of the step size for example, to be added as specified by the formula above when enough bits are alike, the circuit shown in FIG. 3 shifts a binary representation of the step size to the right in a register by four places and then adds it to the existing step size. This is the well known mathematical equivalent to dividing by 16, but the four lowest order bits will be shifted below the range of the adder and lost. As a result of this truncation, the computation does not yield exactly 1/16 of the step size to be added to the existing step size unless that particular step size had zeros in the four low order bits. Similarly, when subtracting 1/64 of the step size value, the circuit shifts the step size six places to the right and then subtracts the resulting value from the existing step size. This will lose six low order bits. As a result, when attempting to add 1/16 and subtract 1/64 as shown by the above function as compared with subtracting 1/64, a three to one ratio is not always maintained. If the step size is large, then the ratio is quite close to three to one but will seldom be absolutely perfect. As the step size decreases, the significance of losing four or six bits of resolution becomes greater.

Turning to FIG. 3, a detailed description of the circuit embodiment shown will now be given. The delay devices 1 and 2 are single bit shift registers which are clocked by the sample clock for storing the two previously received comparator samples. Thus, at any sample time $D_n$, the two most recent samples are also available at the input to the register 1, the output of register 1, and the output of register 2 respectively. The AND circuit 3 will yield a 1 at its output only if all three of the previous samples happen to be ones. The inverting OR block 4 monitors the three previous samples and will yield a 1 output only if all three previous samples are 0. Thus, the AND gate and the OR gates 3 and 4 yield ones to the input of OR gate 5 upon the occurrence of three like bits in sequence whether they be 1's or 0's. The OR gate 5 presents a 1 to unit 8 under either circumstance. If both the AND gate 3 and OR gate 4 have 0 outputs, block 5 will present a 0 input to block 8. In this manner, circuit elements 1 through 5 present a 1 to block 8 if the three previous samples are all 1's or are all 0's. If all three of the samples are not alike, a 0 will be passed through block 8.

The fifteen bit parallel register shown in block 9 holds the latest step size. The step size shown is of 15 bits magnitude with no specific sign. The sign of the step is contributed at its output by the latest compare bit sample $D_n$ prior to the time that this sample is added into the delta modulation filter. A different number of bits could be used for this portion of the circuit but 15 bits were chosen to optimize the companding range with the error recovery that is due to truncation.

The three-way adder shown in block 11 calculates the binary sum of the outputs from blocks 7, 8 and 9, feeding its result to block 10 which will, under proper conditions, forward the output to block 9 at the end of the sample time.

Block 7 functionally multiplies the step size from block 9 by $-1/64$ and feeds the result to the adder 11. The multiplication is achieved by generating the two's complement of the value from block 9 which gives the minus sign and then shifting to the right six bit positions while filling the left most six bits with 0's and dropping or truncating the right most six bits as they are passed to adder 11. This right shift of six bits is equivalent to dividing by 64 and doing it on the two's complement is the equivalent of the negated sign.

Block 6 is functionally shown as a multiplier to multiply by 1/16. In fact, as actually implemented, block 6 is nothing but wiring to achieve a 4 bit right shift from the output of block 9 to block 8. The left most four bits are filled with 0's and again the right most four bits are shifted out of the end or are truncated. This is equivalent to dividing the size of the step by 16.

Block 8 is symbolically shown as a multiplier. It multiplies the output from block 6 by a 1 or a 0 coming from OR gate 5. Block 8 is, in fact, merely an AND gate. Block 8 ANDs the output of block 5 with each of the bits from block 6. Thus, if block 5 has an output that is a 1, the bits from block 6 are passed through to adder 11. If the block 5 output is a 0, the outputs of block 8 are forced to 0 and passed to the adder 11. To this point, the adder 11 has all of the inputs and outputs truncated to 15 binary bits. The output of adder 11 will be the step size generated in block 9 minus 1/64th of that same step size and plus 0 if the last three sample bits are not alike or plus the step size times 1/16th of that step size if the last three bits are alike.

Block 10, with some exception, transfers the output from the adder to the input of block 9 without modification to become the step size for the next sample time. The exception is to insure that the step size will never become less and at least 63 times as large as the least significant bit. The reason for this is that if the step size is too small, the calculation of a $-1/64$th will be all zeros and the step size can never increase or decrease. Block 10 can achieve the desired function of preventing this non-start condition in several ways. Either a power-on reset can be used to set the register 9 to 63 or 64 for convenience times the least significant bit or the output of the adder can be monitored and if it is less than 63 or 64 times the least significant bit the circuit 10 can force the value to be at least 63 or 64 times the least significant bit.

FIG. 4 illustrates the effect of truncation on the ratio of the quantity $1/16-1/64$ to the $1/64$ value. The reciprocal of this ratio can be used to yield the density of occurrences of the last three bits being alike. The precise calculations with truncation exhibit discrete plateaus which will maintain themselves over a range of 16 times the least significant bit, and will cycle over a range of 64 times the least significant bit with the result getting progressively closer to the ideal three to one ratio as the step size increases. The plateaus will leave ambiguous step size information except for the fact that the compander is constantly searching, increasing or decreasing the step size so that the average ratio around a given step size yields the average density of three like bits. The average, although close it ideal, is not the same at any two levels. It may be shown that such a compander will achieve all of the desired functions with little or, in most cases, no compromization in effect. It may be seen that due to the truncation effects, the non-linearity in the companding function will recover from errors is step size information that will be detected at the receiving end.

Having thus described my invention with reference to a preferred embodiment thereof, what is desired to be protected by Letters Patent is as follows:

I claim:

1. In a digital delta modulating, companded communication system transmitter or receiver, the improved method of operating a compander having means for generating variable delta step sizes, comprising steps of:

maintaining a ratio of three like bit occurrences to three unlike bit occurrences of one to three in the serially transmitted or received bit stream by receiving serially developed digital data bits representative of the step polarity to be used to generate the step size in the compander;

analyzing said serially developed bits until at least three successive like bits are identified;

when three successive like bits have been identified, generating an increase in the step size to be generated by calculating a first fractional amount of the previously existing step size and adding it to the existing step size, and at all other times when three like bits have not been successively detected generating a decrease in the step size by calculating a second fractional amount of the step size existing and subtracting it from said previously existing step size;

truncating said calculation of said fractional step size amounts to imperfect approximations by eliminating at least n of the low order bits during said computation so that the actual fractional step size modification amounts computed will vary from the prescribed ideal fractions actually attempted and the resulting density of like bits will vary with said step size so that, upon receipt of digital data that may have been distorted by error in transmission or propagation so that it differs from that which was sent, said step size generation in said compander circuit will generate an effectively corrective step size delta which is greater or less than that necessary to represent the actual signal received so that the output signal will converge back toward the direction necessary to correct the output amplitude and recover from said errors.

2. The method as described in claim 1, wherein:
said first fractional amount and said second fractional amount are chosen so that said first fractional amount is three times the size of said second fractional amount in absolute magnitude.

3. The method as described in claim 1, wherein:
said first fractional amount is equal to 3/n and said second fractional amount is 1/n where n is an integral number related to the rate at which said step size signals are generated or received.

4. The method as described in claim 2, wherein:
said first fractional amount is equal to 3/n and said second fractional amount is 1/n where n is an integral number related to the rate at which said step size signals are generated or received.

5. The method as described in claim 1 or 2 or 3 or 4, wherein:
said n is a power of 2.

6. A method as described in claim 1 or 2 or 3 or 4, wherein:
said n is 64.

7. In a digital delta modulating, companded communication system transmitter or receiver, the improved method of operating a compander having means for generating variable delta step sizes, comprising steps of:
maintaining a ratio of three like bit occurrences to three unlike bit occurrences of one to three in the serially transmitted or received bit stream by receiving serially developed digital data bits representative of the step polarity to be used to generate the step size in the compander;
analyzing said serially developed bits until at least three successive like bits are identified;
when three successive like bits have been identified, generating an increase in the step size to be generated by calculating a first fractional amount of the previously existing step size and adding it to the existing step size and calculating a second fractional amount of the previously existing step size and subtracting it from the existing step size, and at all other times when three like bits have not been successively detected, subtracting said second fractional amount from said previously existing step size;
truncating said calculation of said fractional step size amounts to imperfect approximations by eliminating at least n of the low order bits during said computation so that the actual fractional step size modification amounts computed will vary from the prescribed ideal fractions actually attempted and the resulting density of like bits will vary with said step size so that, upon receipt of digital data that may have been distorted by error in transmission or propagation so that it differs from that which was sent, said step size generation in said compander circuit will generate an effectively corrective step size delta which is greater or less than that necessary to represent the actual signal received so that the output signal will converge back toward the direction necessary to correct the output amplitude and recover from said errors.

8. The method as described in claim 7, wherein:
said first and second fractional amounts are chosen so that their ratio of absolute magnitudes taken as said first to said second fractional amount is four to one.

9. The method as described in claim 7, wherein:
said first fractional amount is equal to 4/n and said second fractional amount is 1/n where n is an integral number related to the rate at which said step size signals are generated or received.

10. The method as described in claim 8, wherein:
said first fractional amount is equal to 4/n and said second fractional amount is 1/n where n is an integral number related to the rate at which said step size signals are generated or received.

11. The method as described in claim 7 or 8 or 9 or 10, wherein:
said n is a power of 2.

12. The method as described in claim 7 or 8 or 9 or 10, wherein:
said n is 64.

* * * * *